United States Patent [19]

Iwamura et al.

[11] Patent Number: 4,853,560
[45] Date of Patent: Aug. 1, 1989

[54] LOGIC CIRCUIT AND SEMICONDUCTOR INTEGRATED CIRCUIT DEVICE CAPABLE OF OPERATING BY DIFFERENT POWER SUPPLIES

[75] Inventors: Masahiro Iwamura; Hideo Maejima; Ikuro Masuda, all of Hitachi, Japan

[73] Assignee: Hitachi, Ltd., Tokyo, Japan

[21] Appl. No.: 149,187

[22] Filed: Jan. 27, 1988

[30] Foreign Application Priority Data

Feb. 6, 1987 [JP] Japan ............................. 62-24565

[51] Int. Cl.[4] .................. H03K 19/003; H03K 17/10; H03K 17/06; H03K 3/013
[52] U.S. Cl. ............................. 307/296.1; 307/200.1; 307/264; 307/475; 307/570
[58] Field of Search ........... 307/443, 475, 441, 200 B, 307/296 R, 296 A, 297, 260, 264, 270, 279, 239, 570, 571, 446, 350, 465, 296.1, 296.3, 296.6

[56] References Cited

U.S. PATENT DOCUMENTS

| | | | |
|---|---|---|---|
| 4,158,804 | 6/1979 | Butler et al. | 307/297 X |
| 4,230,951 | 10/1980 | Suzuki et al. | 307/200 B |
| 4,716,313 | 12/1987 | Hori et al. | 307/296 R X |
| 4,734,595 | 3/1988 | Le Roux et al. | 307/296 R X |
| 4,758,743 | 7/1988 | Dehganpour et al. | 307/296 R X |
| 4,760,282 | 7/1988 | Kuo et al. | 307/296 R X |

Primary Examiner—Stanley D. Miller
Assistant Examiner—David R. Bertelson

[57] ABSTRACT

When a counter-part power supply designator of a first LSI designates that the counter-part power supply voltage of another LSI is a first power supply difference which is the same as the power supply difference of its own, an output circuit control controls an output circuit and the output circuit produces an output signal having a level adaptive to the counter-part LSI operating at the first power supply voltage. When the counter-part power supply voltage designator designates that the counter-part power supply voltage difference, lower than the first power supply voltage difference, the output circuit control controls the output circuit and the output circuit produces an output signal having a level adaptive to the counter-part LSI operating at the second power supply voltage difference. Thus, a plurality of LSIs can be operated at mutually different power supply voltages.

66 Claims, 12 Drawing Sheets

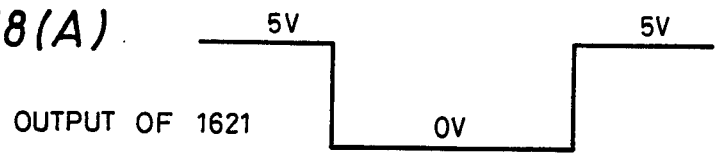
FIG. 18(A) OUTPUT OF 1621
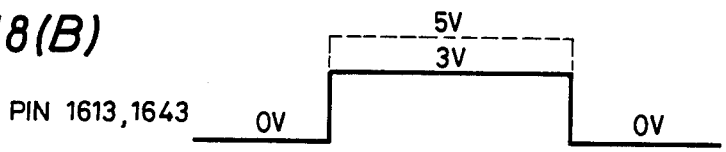
FIG. 18(B) PIN 1613, 1643
FIG. 18(C) INPUT OF 1649
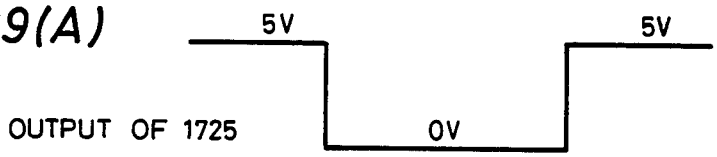
FIG. 19(A) OUTPUT OF 1725
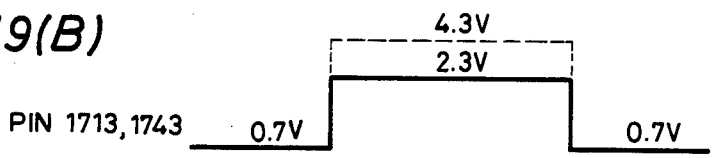
FIG. 19(B) PIN 1713, 1743
FIG. 19(C) INPUT OF 1749

LOGIC CIRCUIT AND SEMICONDUCTOR INTEGRATED CIRCUIT DEVICE CAPABLE OF OPERATING BY DIFFERENT POWER SUPPLIES

BACKGROUND OF THE INVENTION

This invention relates to a logic circuit and to a semiconductor integrated circuit device using the former, and more particularly to a logic circuit and a semiconductor integrated circuit device capable of operating by different power supplies and a semiconductor integrated circuit system constituted by coupling a plurality of semiconductor integrated circuit devices.

Since semiconductor technology has made a remarkable progress, the age of 0.5 μm will arrive in the 1990s. It is said that in such an age of 0.5 μm, the power source voltage must be reduced from the current voltage of 5 V to a lower voltage (e.g. 3 V).

In other words, the 0.5 μm age will be an era where LSIs operating by the power supply of the 5 V system and semiconductor integrated circuit devices (LSIs) operating by the power supply of the 3 V system coexist, and LSIs operating at these two difference power source voltages exist in mixture inside an electronic circuit device constituted by coupling a pluralilty of LSIs.

FIG. 8(A) of the accompanying drawings shows the case where first LSI 811 and second LSI 812 operate at the same power supply level (e.g. 5V). In the drawing, reference numeral 813 represents an output signal line from LSI 811 to LSI 812 and reference numeral 814 represents an output signal line from LSI 812 to LSI 811.

FIG. 8(B) shows the case where LSI 812 operates at a first power supply voltage $V_1$ while LSI 822 operates at a second power supply voltage $V_2$ ($V_2 < V_1$). Reference numeral 823 represents an output signal line from LSI 812 to LSI 822 while reference numeral 824 represents an output signal line from LSI 822 to LSI 821.

FIG. 8(C) shows the case where LSIs 831 and 832 operate at the first power supply voltage $V_1$ while LSI 833 operates at the second power supply voltage $V_2$.

Among the three cases described above, no problem occurs in the mutual interface by the signal lines 813 and 814 in the case of FIG. 8(A) because both LSIs operate at the same power supply level.

In the cases of FIGS. 8(B) and 8(C), however, the following problems might occur because any interface is necessary between LSIs that operate at different power supply levels.

FIG. 9 shows an interface of LSIs 910 and 920 constituted by an ECL circuit. In LSI 910, reference numerals 911 and 913 represent NPN transistors; 914 and 915 are resistors; 916 is a constant current circuit; and 917 is an output pin of LSI 910 which operates at a power supply $-V_1$. The output level appearing at the output pin 917 is given as follows:

$$V_{OH} = 0 - V_{BE} = -0.8V$$

$$V_{OL} = 0 - I_{EE} \cdot R_2 - V_{BE} = -1.6V$$

where $V_{BE}$: base-emitter voltage of NPN 913
$I_{EE}$: current value of constant current circuit 916
$R_2$: resistance of resistor 914.

In other words, in the ECL circuit, the high level output $V_{OH}$ and the low level output $V_{OL}$ are determined irrespective of the level of the operation power supply. Therefore, LSI 920 can normally receive a signal from LSI 910 provided that a signal is received at the base of the NPN transistor 921 and a voltage of about $-1.2$ V, which is at an intermediate level between $V_{OH}$ and $V_{OL}$, is applied as a reference voltage to the base of NPN transistor 922.

It is to be noted specifically from the description given above that there is no specific problem for the ECL circuit even if a plurality of LSIs operate at mutually different power supply voltages.

FIG. 10 shows an inverter circuit as an example of CMOS logic circuit, wherein 1001 is PMOS and 1002 is NMOS. When VIN is at the "1" level, the output VOUT is 0 for V. When VIN is at the "0" level, on the other hand, VOUT is at the same voltage as the power supply voltage $V_1$.

FIG. 11 shows an inverter circuit as an example of BiCMOS logic circuit, wherein 1101 is PMOS; 1102 is NMOS; 1103 and 1104 are NPN bipolar transistors; and 1105 and 1106 are resistors. When VIN is at the "1" level, the output VOUT becomes 0 V. When VIN is at the "0" level, on the other hand, VOUT becomes the same voltage as the power supply voltage $V_1$.

In the case of the CMOS and BiCMOS circuits described above, one of the output levels is substantially equal to the power supply voltage.

Therefore, when LSIs operating at different power supply voltages are connected with one another, the following problem develops.

FIG. 12 shows the case where the output of LSI 1210 operating at the power supply voltage $V_1$ is applied to LSI 1220 operating at the power supply voltage $V_2$ ($V_2 < V_1$). In LSI 1210, reference numeral 1211 represents PMOS; 1212 is NMOS; 1213 is an internal circuit; 1214 and 1215 are parasitic diodes; and 1217 is an output pin. PMOS 1211 and NMOS 1212 together form the output circuit.

In LSI 1220, reference numeral 1221 represents PMOS; 1222 is NMOS; 1223 is an internal circuit performing a predetermined functional operation and preferably a logic operation; 1224 and 1225 are protective diodes; 1226 is a protective resistor; and 1227 is an input pin. PMOS 1221 and NMOS 1222 together form the input circuit, while the diodes 1224, 1225 and the resistor 1226 form the input protection circuit.

When LSI 1210 outputs the "1" level in this example, an abnormally large current keeps flowing through the path of power supply $V_1$ —PMOS 1211 —resistor 1226 —diode 1224 —power supply $V_2$ because $V_2 < V_1$, so that the following problems occur in both LSIs 1210 and 1220.

(1) High power consumption occurs in PMOS 1211 in LSI 1210 due to the abnormal current and reliability drops, too.

(2) High power consumption occurs in the resistor 1226 and the diode 1224 in LSI 1220 due to the abnormal current and reliability drops, too.

FIG. 13 shows the case where the output of LSI 1310 operating at the power supply voltage $V_1$ and that of LSI 1320 operating at the power supply voltage $V_2$ are connected to each other.

In LSI 1310, reference numeral 1311 represents PMOS; and 1312 is NMOS; 1314 and 1315 are parasitic diodes. PMOS 1311 and NMOS 1312 form a tri-state output circuit which is subjected to ON/OFF control by the input signals $E_1$, $E_2$. Reference numeral 1317 represents the output pin of LSI 1310.

In LSI 1320, reference numeral 1321 represents PMOS; 1322 is NMOS; and 1324 and 1325 are parasitic diodes. PMOSs 1321 and 1322 form a tri-state output circuit which is subjected to ON/OFF control by the input signals $E_3$, $E_4$.

In this example, both PMOS 1321 and NMOS 1322 are OFF when $E_3$ is at the "1" level and $E_4$ is at the "0" level and since an abnormally large current keeps flowing through the path of the power supply $V_1$ —PMOS 1311 —diode 1324 —power supply $V_2$ when both $E_1$ and $E_2$ are at the "0" level, the following problems occur in both LSIs 1310 and 1320.

(1) High power consumption occurs in PMOS 1311 in LSI 1310 due to the abnormal current and reliability drops, too.

(2) High power consumption occurs in the parasitic diode 1324 in LSI 1320 due to the abnormal current and reliability drops, too.

FIGS. 14 and 15 show examples of mutual connection using an open drain type output circuit in accordance with a prior art technique in order to prevent the flow of the abnormal current resulting from the mismatch of the power supply voltages.

FIG. 14 shows the case where the output of LSI 1410 operating at the power supply voltage $V_1$ is an input of LSI 1420 operating at the power supply voltage $V_2$ ($V_2 < V_1$).

In LSI 1410, reference numeral 1411 represents NMOS; 1414 is a parasitic diode; 1415 is an internal circuit; and NMOS 1411 constitutes an open drain type output circuit. Reference numeral 1417 represents the output pin of LSI 1410.

In LSI 1420, reference numeral 1421 represents PMOS; 1422 is NMOS; 1423 and 1424 are protective diodes; 1426 is a protective diode; 1425 is an internal circuit; 1427 is the input pin of LSI 1420; and 1430 is a pullup resistor of the open drain output circuit 1411. One of the ends of this resistor is connected to the same power supply as the power supply $V_2$ having a lower voltage and the other end is connected to the output pin 1417 and to the input pin 1427.

When the internal circuit 1415 outputs the "0" level in this example, NMOS 1411 is OFF, a load CL is charged from the power supply $V_2$ through the resistor 1430 and the input pin 1427 of LSI 1420 is at the "1" level equal to the power supply $V_2$.

Accordingly, no abnormal current flows at this time because the protective diode 1423 is not turned ON.

When the internal circuit 1415 outputs the "1" level, on the other hand, NMOS 1411 is turned ON, the charge of the load CL is discharged through NMOS 1411 and the input pin 1427 of LSI 1420 is switched to the "0" level. At this time, the output "0" level is higher than 0 V because the D.C. current flows through the power supply $V_2$, the resistor 1430 and NMOS 1411.

FIG. 15 shows the example where LSI 1510 operating at the power supply voltage $V_1$ and LSI 1520 operating at the power supply voltage $V_2$ are connected to each other by the open drain type output circuit.

In LSI 1510, reference numeral 1511 represents NMOS; 1514 is a parasitic diode; 1515 is an internal circuit which constitutes the open drain type output circuit; and 1517 is the output pin of LSI 1510.

In LSI 1520, reference numeral 1521 represents NMOS; 1524 is a parasitic diode; 1525 is an internal circuit; and NMOS 1521 constitutes the open drain type output circuit. Reference numeral 1530 represents a pullup resistor.

When NMOS 1521 of LSI 1520 is OFF and NMOS 1511 is OFF in LSI 1511 in this example, the load CL is charged from the power supply $V_2$ through the resistor 1530, the potential of the input pin 1527 of LSI 1520 is equal to the potential of $V_2$, and no abnormal current flows because both NMOS 1521 and the parasitic diode 1524 are OFF.

When NMOS 1511 is ON, on the other hand, the charge of the capacitance load LC is discharged through NMOS 1511 and the output pin 1517 is switched to the "0" level. Since the D.C. current flows through the power supply $V_2$, the resistor 1530 and NMOS 1511 at this time, the output "0" level is higher than 0 V.

As described above, mutual connection by the open drain output can solve the problem of the abnormal current resulting from the mis-match of the power supply voltages, but is not free from the following problems. Firstly, the D.C. current flows when the output is at the "0" level so that the number of outputs is limited from the aspect of power consumption. The "0" level of the output is higher than 0 V and the output amplitude drops. Secondly, since the switching speed of the output to the "1" level is determined by the time constants of the pullup resistor and load capacitance, the transmission speed of signals is low and the application to a high speed system is therefore difficult. If the pullup resistance is reduced in order to improve the speed, power consumption due to the D.C. current becomes greater. Accordingly, both of the requirements for higher operation speed and lower power consumption cannot be satisfied simultaneously.

As described above, when LSIs operating at different power supply voltages are connected mutually in accordance with the prior art technique, the problems such as the occurrence of the abnormal current, the increase of power consumption and the increase of the delay time develop unavoidably.

SUMMARY OF THE INVENTION

It is therefore a primary object of the present invention to provide a logic circuit and a semiconductor integrated circuit device that can be connected with one another normally without increasing the power consumption and delay time even in the environment in which they operate at different power supply voltages, and a semiconductor integrated circuit device system using them.

In a logic circuit and a semiconductor integrated circuit device which operate at a first power supply potential difference, there are provided a selection signal generation circuit and a power supply potential selection circuit for designating whether a counter-part LSI, to which the output thereof is to be connected, operates at the first power supply potential difference or at a second power supply potential difference lower than the first power supply potential difference.

When counter-part power supply designation means designates that the counter-part power supply voltage is a first power supply voltage which is the same as that of its own, output circuit control means controls an output circuit and this output circuit outputs a signal level which can be adapted to the counter-part LSI which operates at the first power supply voltage. When the counter-part power supply voltage designation means designates that the power supply voltage difference of the counter-part is a second power supply voltage difference which is lower than the first power supply voltage difference, the output circuit control means controls the output circuit and the output circuit in turn outputs a signal level which can be adapted to the counter-part LSI operating at the second power supply voltage difference.

The above and other objects and novel features of the present invention will become more apparent from the detailed description of preferred embodiments thereof when taken in conjunction with the accompanying drawings.

BRIEF DESCRIPTION OF THE DRAWINGS

FIGS. 18A, 18B, and 18C show a timechart of FIG. 16; and

FIGS. 19A, 19B, and 19C show a timechart of FIG. 17.

DESCRIPTION OF THE PREFERRED EMBODIMENTS

Figure 1:
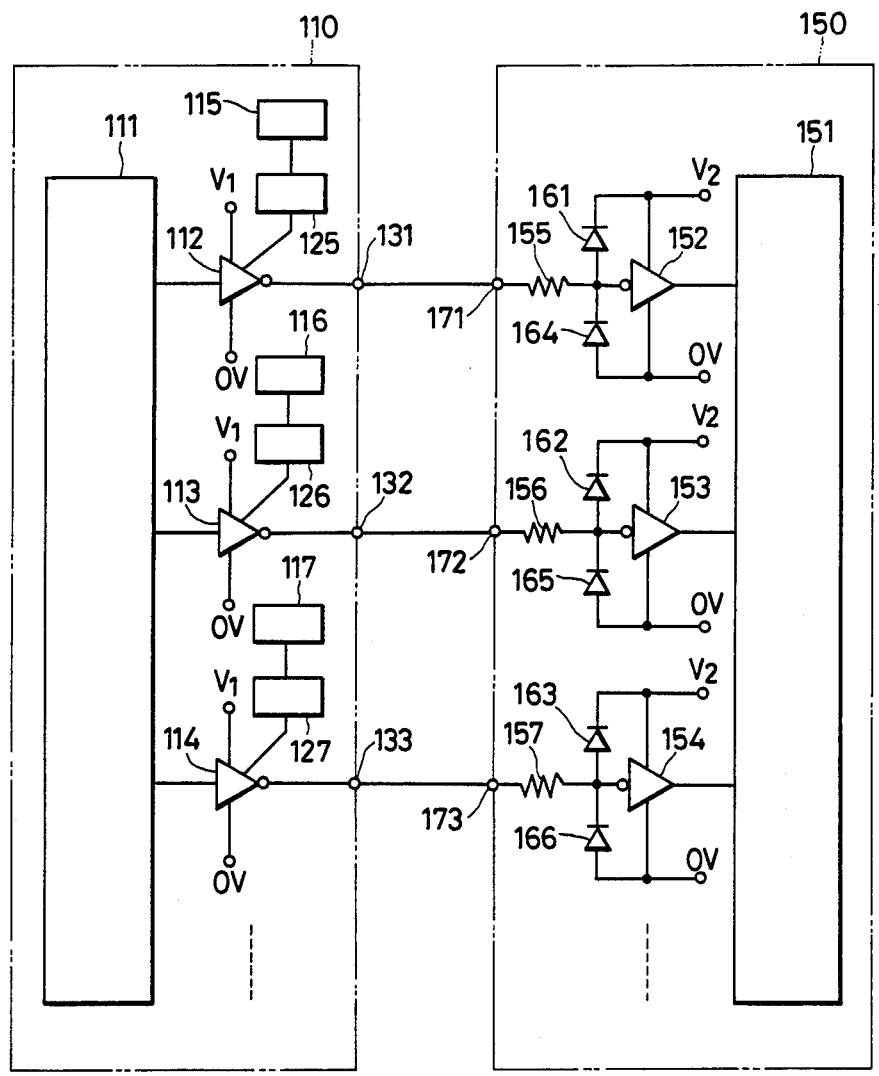
FIG. 1 shows a first embodiment of the present invention.

FIG. 1 shows a first embodiment of the present invention. In the drawing, reference numeral 110 represents a first semiconductor integrated circuit device (LSI) operating at a first power supply potential difference $V_1$ ($=V_1-0$) and reference numeral 150 represents a second semiconductor integrated circuit device (LSI) operating at a second power supply potential difference $V_2$ ($=V_2-0$; $V_2<V_1$). In LSI 110, reference numeral 111 represents an internal circuit; 112-114 are output circuits; 115-117 are counter-part power supply designation means as a selection signal generation circuit for generating a selection signal which selects one power supply potential from a plurality of power supply potentials; 125-127 are output circuit control means as a power supply potential selection circuit for selecting one of a plurality of power supply potentials on the basis of the selection signal described above; and 131-133 are output pins of LSI 110. Incidentally, an input buffer circuit is also disposed, though it is not shown in the drawing.

In LSI 150, reference numeral 151 represents an internal circuit; 152-154 are input buffer circuits; 155-157 are protective resistors; 161-166 are protective diodes; and 171-173 are input pins of LSI 150. There is also disposed an output buffer circuit, though it is not shown in the drawing.

Figure 12:
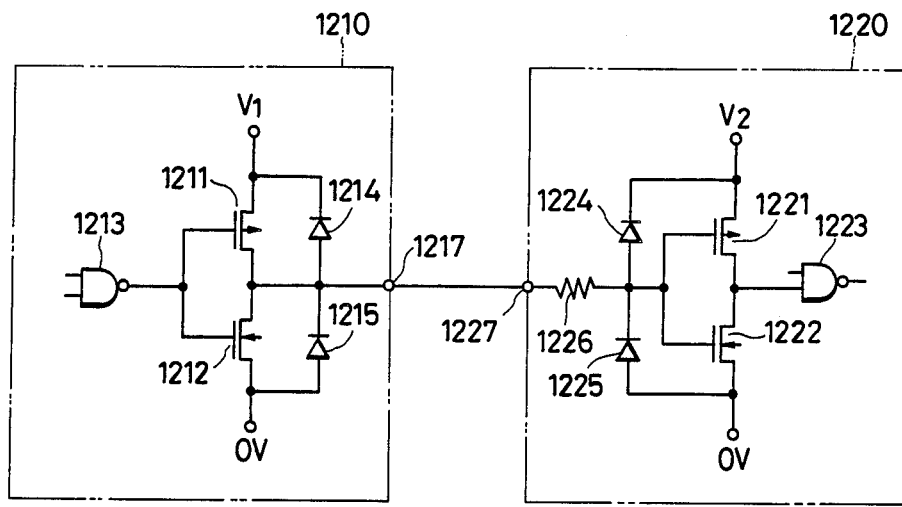
FIG. 12 shows a connection example of the output and input of LSIs operating at different power supply voltages as a conventional example.
Figure 13:
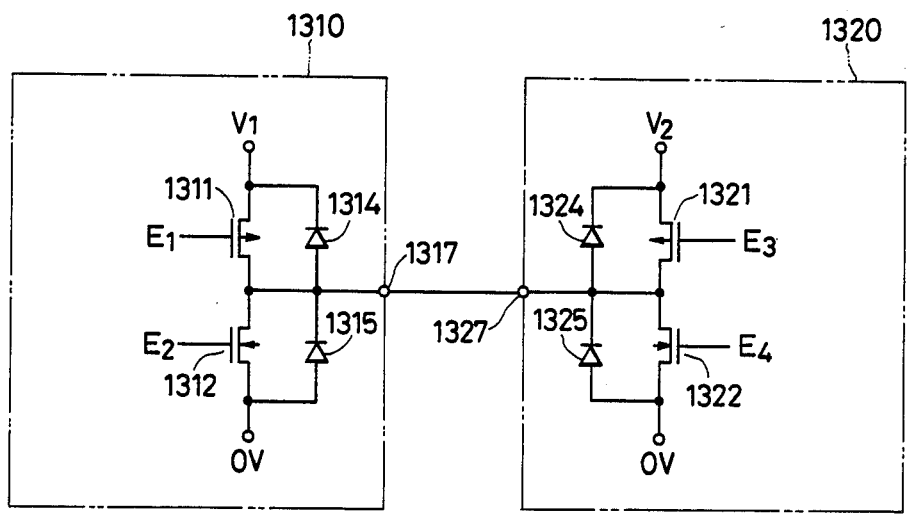
FIG. 13 shows a connection example of outputs of LSIs operating at different power supply voltages as a conventional example.
Figure 14:
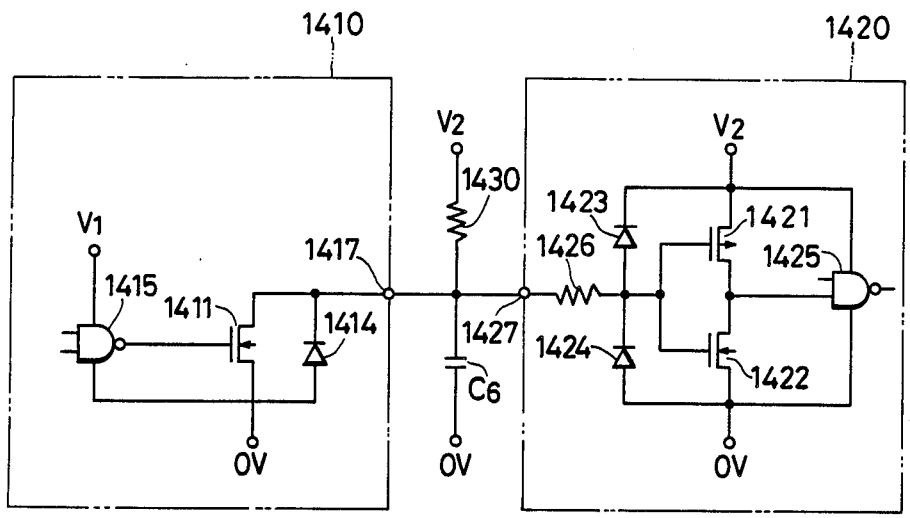
FIG. 14 shows a connection example of output and input of LSIs operating at different power supply voltages by an open drain output as a conventional example.
Figure 15:
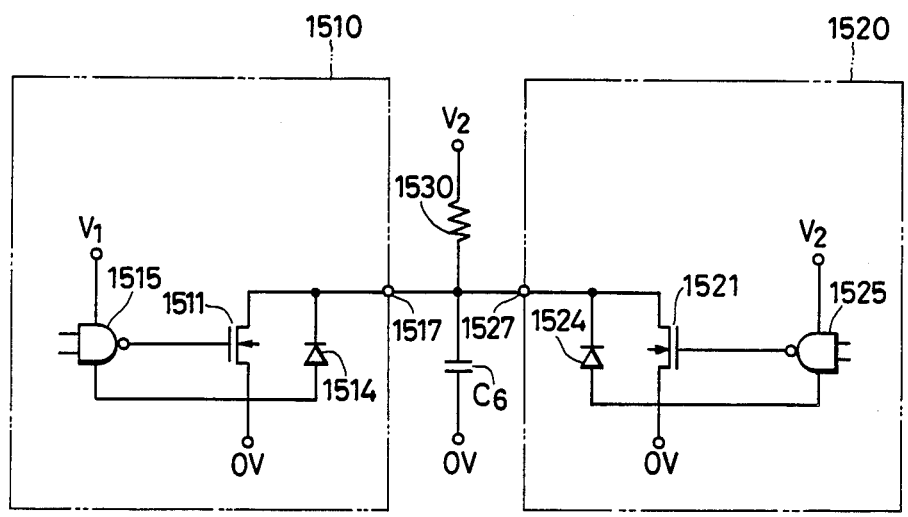
FIG. 15 shows a connection example of outputs of LSIs operating at different power supply voltages by an open drain output as a conventional example.

In this embodiment, the counter-part LSI 150 to which the output of LSI 110 is connected operates at the second power supply potential difference $V_2$ which is lower than the first power supply potential difference $V_1$. Therefore, the counter-part power supply designation means 115-117 disposed in LSI 110 designate the output circuit control means 125-127 that the counter-part power supply potentials are all $V_2$. Therefore, the output circuit control means 125-127 control the output circuits 112-114 and output a signal level which can be adapted to the power supply of the counter-part LSI. When, for example, the first power supply voltage is 5 V and the counter-part LSI operates at the second power supply voltage of 3 V, the output circuits 131-133 output the "0" level which is substantially 0 V and the "1" level which is substantially 3 V, respectively. Therefore, the abnormal current flowing from LSI 110 having the higher power supply voltage to the second power supply through the protective resistors and the protective diodes, that has already been described with reference to FIGS. 12 and 13, does not occur.

Figure 2:
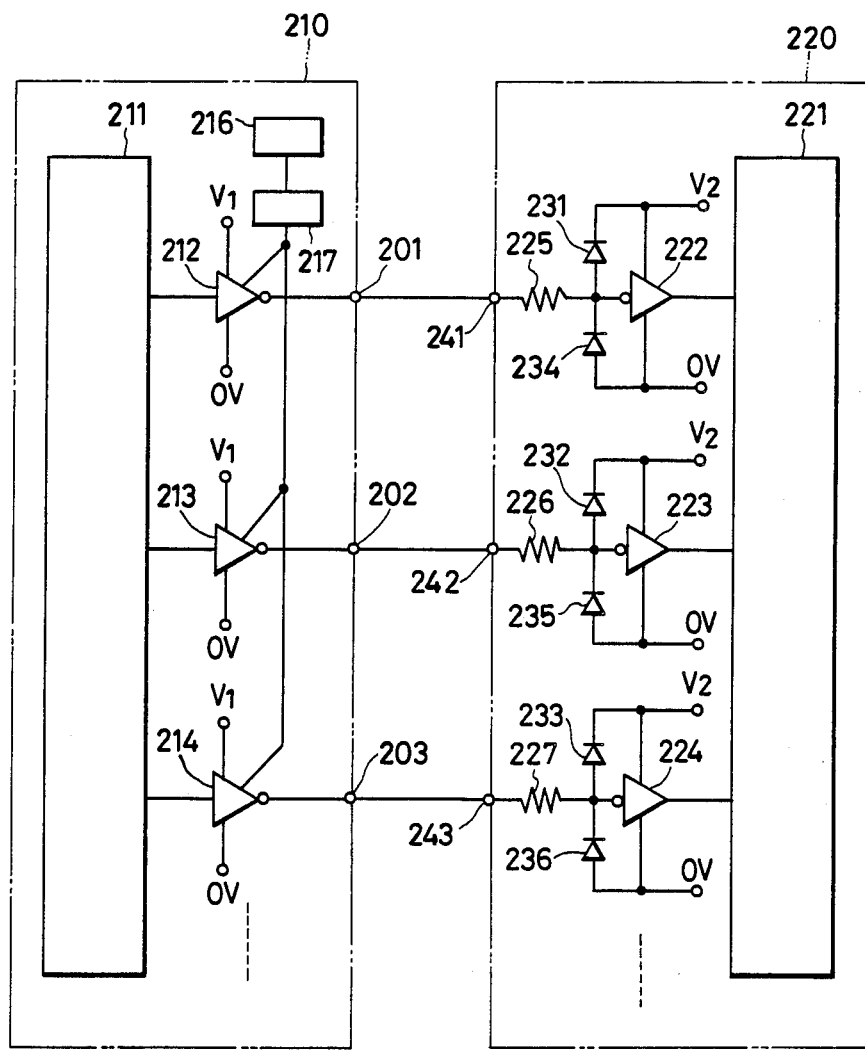
FIG. 2 shows a second embodiment of the present invention.

FIG. 2 shows a second embodiment of the present invention. In the drawing, reference numeral 210 represents LSI operating at the first power supply voltage $V_1$, and 220 represents LSI operating at the second power supply voltage $V_2$ ($V_2<V_1$). Since LSI 220 has the same structure as that of LSI 150 shown in FIG. 1, its explanation will be omitted. In LSI 210, reference numeral 211 represents an internal circuit; 212-214 are output circuits; 216 is counter-part power supply designation means; 217 is output circuit control means; and 201-203 are output pins of LSI 210 which have an input buffer circuit, not shown in the drawing.

Since the counter-part LSI 220 operates at the power supply voltage $V_2$ in this embodiment, the counter-part power supply designation means 216 designates the output circuit control means 217 that the counter-part power supply potential difference is $V_2$. Since the output of the output circuit control means 217 is connected to all the output circuits 212-214, these output circuits 212-214 output the signal level which is suitable for the power supply voltage $V_2$ of the counter-part LSI 220. For instance, when $V_2$ is 3 V, the output circuits 212-214 output the "0" level of 0 V and the "1" level of 3 V. Therefore, the abnormal current flowing from LSI 210 having the higher power source voltage to the second power supply $V_2$ through the protective resistor and the protective diode does not occur in the same way as in the embodiment shown in FIG. 1.

The characterizing difference between the embodiment shown in FIG. 1 and the embodiment shown in FIG. 2 resides in whether the output circuits are controlled individually or exclusively.

In the embodiment shown in FIG. 1, the counter-part power supply designation means 115–117 and the output circuit control means 125–127 are disposed in such a manner as to correspond to the output circuits 112–114, whereas in the embodiment shown in FIG. 2, one counter-part power supply designation menas and one output circuit control means are disposed commonly for the output circuits 212–214. Such exclusive control is effective when the counter-part LSI is specified to a memory LSI, for example.

Figure 3:
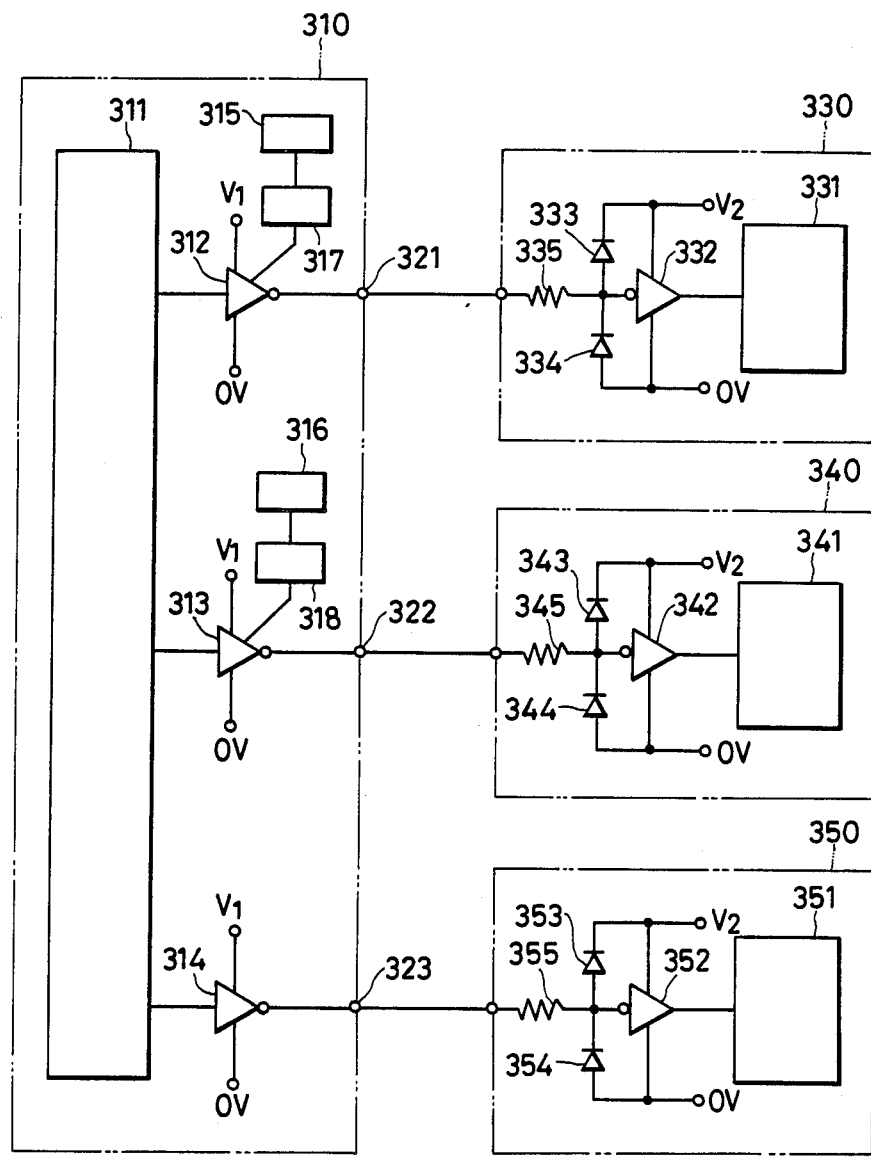
FIG. 3 shows a third embodiment of the present invention.

FIG. 3 shows a third embodiment of the present invention. In the drawing, reference numeral 310 represents LSI operating at the first power supply voltage $V_1$, 330 is LSI operating at the second power supply voltage $V_2$ and 340 and 350 are LSIs operating at the first power supply voltage.

In this embodiment, LSI 310 operating at the first power supply voltage is connected to both LSIs 340, 350 operating at the first power supply voltage $V_1$ and to LSI 330 operating at the second power supply voltage $V_2$.

In LSI 310, reference numeral 311 represents an internal circuit; 312–314 are output circuits; 315 and 316 are counter-part power supply designation means; 317 and 318 are output circuit control means; and 321–323 are the output pins of LSI 310.

In LSIs 330, 340 and 350, reference numerals 331, 341 and 351 represent internal circuits; 332, 342 and 352 are input circuits; 333, 334, 343, 344, 353 and 354 are protective diodes; and 335, 345 and 355 are protective resistors.

Since the output of the output circuit 312 of LSI 310 is connected to LSI 330 operating at the second power supply voltage $V_2$, the counter-part power supply designation means 315 designates the output circuit control means 317 that the counter-part power supply voltage is $V_2$. Accordingly, the output circuit 312 outputs the "0" level of 0 V and the "1" level of $V_2$ V suitable for the power supply voltage $V_2$ of the counter-part LSI 330. Since the output of the output circuit 313 is connected to LSI 340 operating at the first power supply voltage $V_1$, the counter-part power supply designation means 310 designates the output circuit control means 318 that the counter-part power supply voltage is $V_1$. Accordingly, the output circuit 313 outputs the "0" level of 0 V and "1" level of $V_1$ V suitable for the power supply voltage $V_1$ of the counter-part LSI 340.

Since there are no counter-part power supply designation means and output circuit control means, the output circuit 314 outputs the "0" level of 0 V and the "1" level of $V_1$ V. Accordingly, the connection of the output circuit 314 is limited to LSI operating at the power supply voltage $V_1$.

Figure 4:
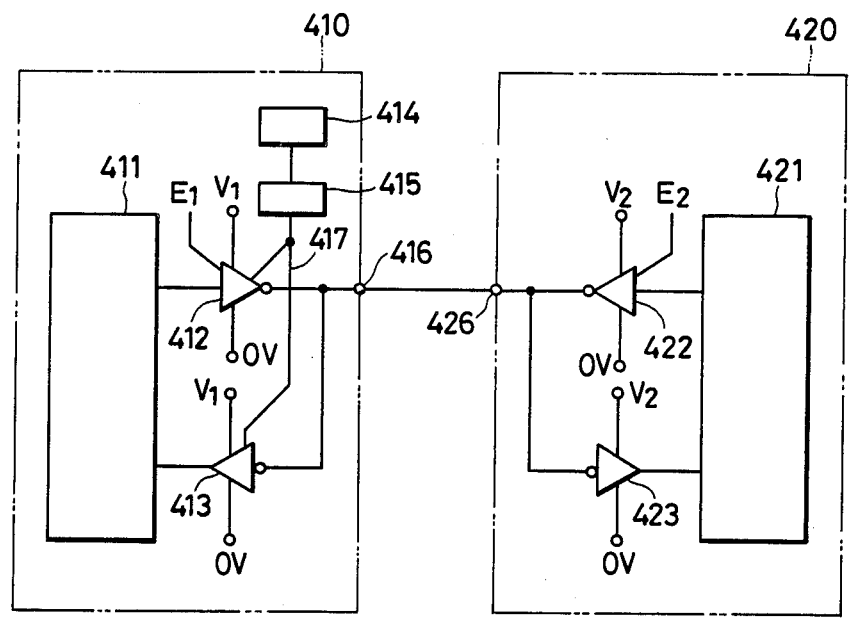
FIG. 4 shows a fourth embodiment of the present invention.

FIG. 4 shows a fourth embodiment of the present invention. In the drawing, reference numeral 410 represents LSI operating at the first power supply potential difference $V_1$ while 420 represents LSI operating at the second power supply voltage $V_2$ ($V_2 < V_1$).

In LSI 410, reference numeral 411 represents an internal circuit; 412 is an output circuit, 413 is an input circuit; 414 is counter-part power supply designation means; 415 is output circuit control means; and 416 is the input/output pin of LSI 410 for both inputting and outputting operations.

In LSI 420, reference numeral 421 represents an internal circuit 422 is an output circuit; 423 is an input circuit; and 426 is the input/output pin of LSI 420 for both inputting and outputting operations.

Since the power supply potential difference of LSI 420 is $V_2$, the counter-part power supply designation means 414 designates the output circuit control means 415 that the counter-part power supply potential difference is $V_2$. Accordingly, the output circuit control means 415 controls the output circuit 412 and the output circuit 412 outputs the "0" level of 0 V and the "1" level of $V_2$ V suitable for the counter-part power supply $V_2$.

On the other hand, the output circuit control means 415 controls not only the output circuit 412 but also the input circuit 413 simultaneously so that the logic threshold value of the input circuit 413 is best suited for the output level of the output circuit 422 of LSI 420 operating at the second power supply voltage $V_2$. As a definite example, when the "0" level of the output circuit 422 is 0 V and its "1" level is $V_2$ V, the preferred logic threshold value of the input circuit is $V_2/2$ V.

Figure 5:
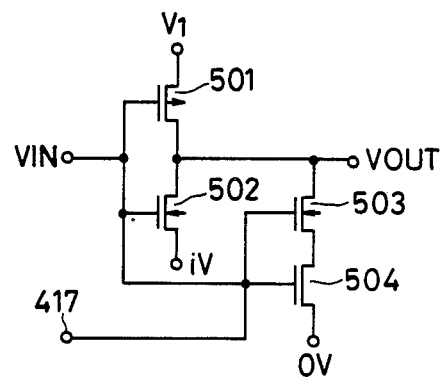
FIG. 5 shows an example of an input circuit.

FIG. 5 shows a structural example of the input circuit 413 (but the protective circuit is omitted). In the drawing, reference numeral 501 represents PMOS while 502 and 503 represent NMOS.

In the drawing, when the output 417 of the output circuit control means is at the "0" level, NMOS 503 is OFF. Accordingly, the logic threshold value of the input circuit is determined at this time by the sizes of PMOS 501 and NMOS 502. When the input VIN is a signal from 0 V to $V_1$ V, the preferred logic threshold value is $V_1/2$ V.

On the other hand, when the output 417 of the output circuit control means 415 is at the "1" level, NMOS 503 is ON and the logic threshold value can be set to $V_2/2$ by selecting suitable sizes for MOSs 501 and 504.

Figure 6A:
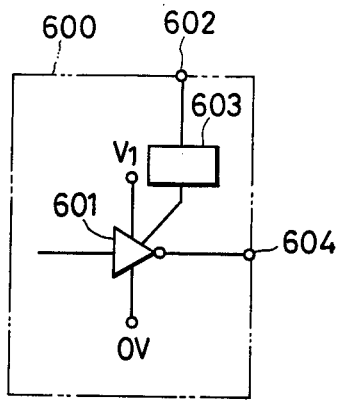
FIGS. 6A, 6B, and 6C show an example of a counter-part power supply designation means.
Figure 6B:
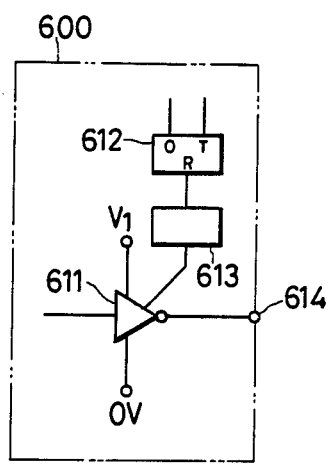
Figure 6C:
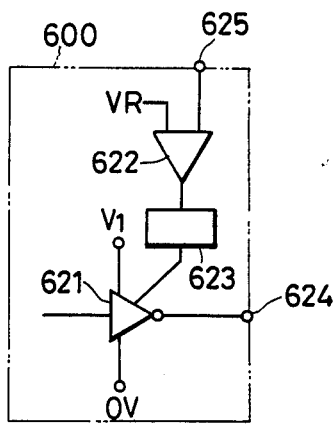

FIGS. 6(A) to 6(C) show examples of the counter-part power supply designation means.

In FIG. 6(A), reference numeral 600 represents LSI operating at the first power supply potential difference $V_1$; 601 is an output circuit; 603 is output circuit control menas; and 602 and 604 are the input and output pins of LSI 600, respectively. In this embodiment, the counter-part power supply designation means is the input pin 602 and designates whether the power supply potential difference of the counter-part LSI is $V_1$ or $V_2$ by the binary signal given to the input pin 602.

In FIG. 6(B), reference numeral 611 represents an output circuit; 613 is output circuit control means; 612 is a flip-flop; and 614 is the output pin of LSI 600. In this embodiment, the counter-part power supply designation means is the flip-flop 612. When the "0" level data or the "1" level data is written into this flip-flop, it designates whether the counter-part power supply potential difference is $V_1$ or $V_2$.

In FIG. 6(C), reference numeral 621 represents an output circuit; 623 is output circuit control means; 622 is counter-part power supply identification means; and 625 and 624 are the input and output pins of LSI 600, respectively. In this embodiment, the counter-part power supply potential difference is given to the input pin 625 and this is identified by the power supply identification means 622. This power supply identification means 622 consists of a comparator, for example, which receives a reference voltage VR at one of its inputs and the counter-part power supply voltage at the other, compares them with each other and designates whether the counter-part power supply potential difference is $V_1$ or $V_2$.

Figure 7A:
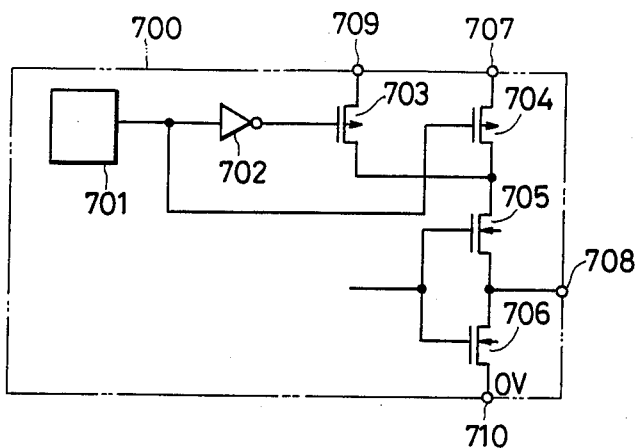
FIGS. 7A, 7B, and 7C show an example of an output circuit control means.
Figure 7B:
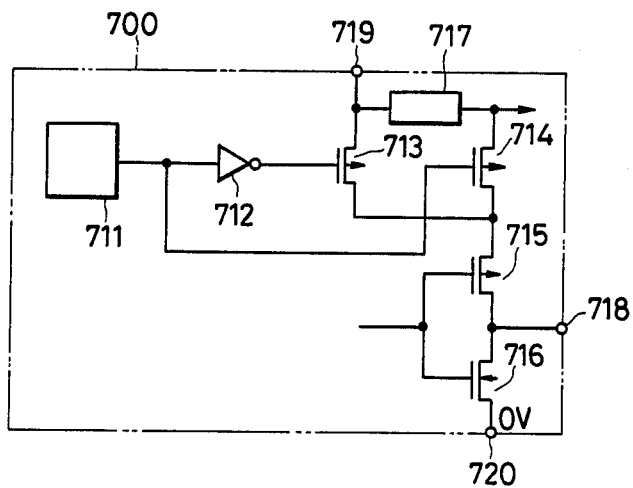
Figure 7C:
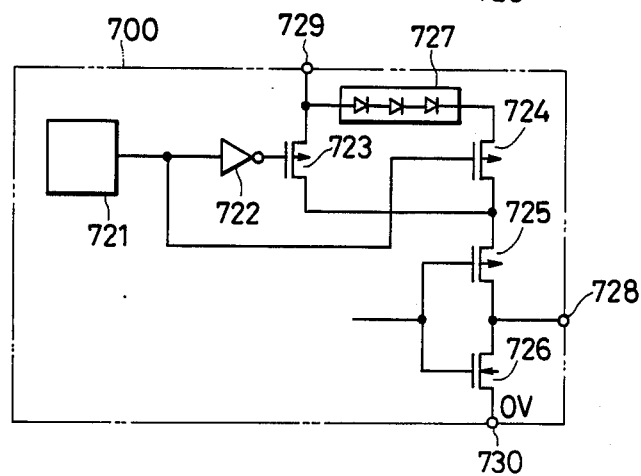
Figure 8A:
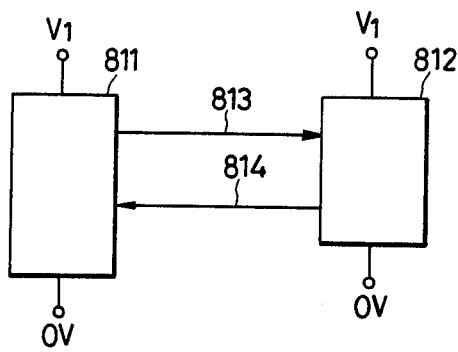
FIGS. 8A, 8B, and 8C show a connection example of a plurality of LSIs operating at different power supplies as an example of the prior art technique.
Figure 8B:
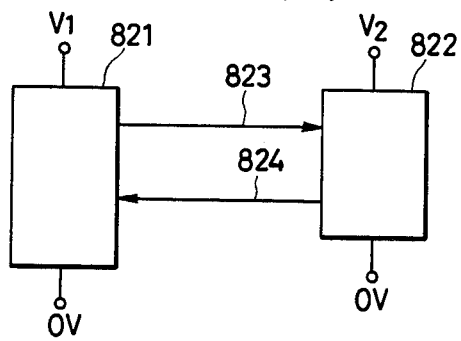
Figure 8C:
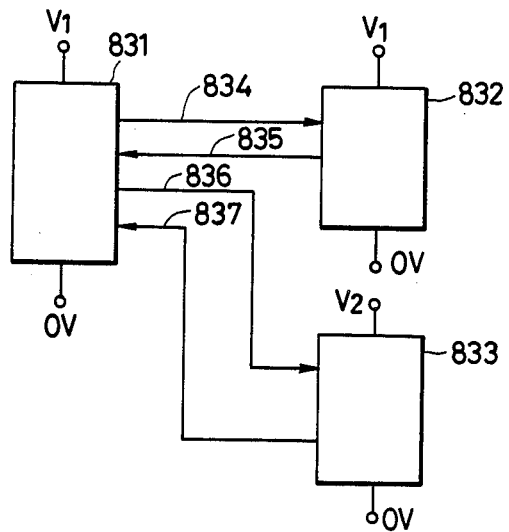
Figure 9:
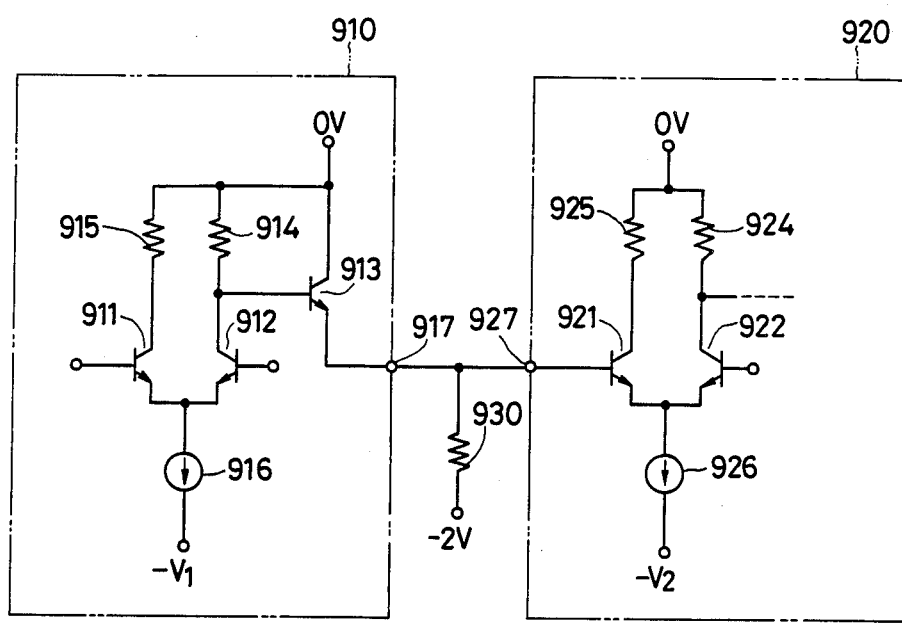
FIG. 9 shows a connection example of ECL circuits as a conventional example.
Figure 10:
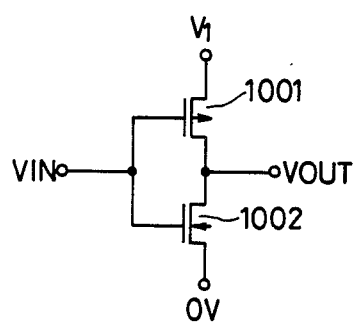
FIG. 10 shows an example of a CMOS circuit.
Figure 11:
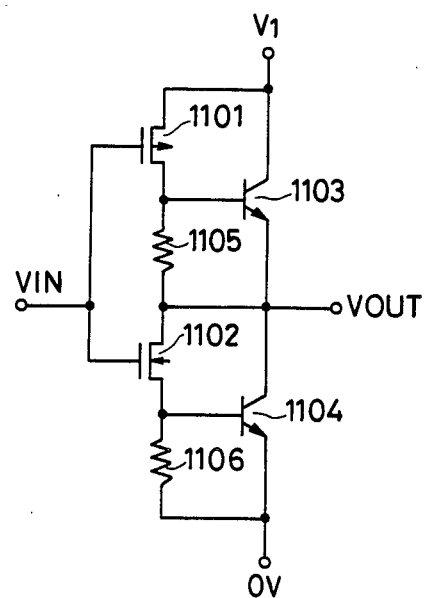
FIG. 11 shows an example of a BiCMOS circuit.

FIGS. 7(A) to 7(C) show a example of the logic circuit 700 in accordance with the present invention.

In FIG. 7(A), reference numeral 701 represents counter-part power supply designation means; 702 is an inverter; 703, 704 and 705 are PMOS; 706 is NMOS; 708 is the output pin of LSI 300; 709 is the input pin of the first power supply $V_1$; 710 is a reference potential (e.g. 0 V) pin; and 707 is the pin for inputting the counter-part power supply.

In this embodiment, the inverter 702 and PMOSs 703, 704 together constitute the output circuit control means, while PMOS 705 serving as a first semiconductor switch circuit and NMOS 706 serving as a second semiconductor switch circuit together constitute the output circuit. The source of PMOS 703 receives the first power supply voltage $V_1$ from the pin 709, the source of PMOS 704 receives the counter-part power supply potential $V_2$ from the pin 707 and the drains of these transistors are connected in common to the source of PMOS 705.

When the output of the counter-part power supply designation means 701 is at the "0" level, PMOS 703 is OFF and PMOS 704 is ON. Therefore, the counter-part power supply voltage $V_2$ is applied to the source of PMOS 705. The source-drain path of PMOS 705 forms a current path from the power supply potential $V_2$ to the output terminal 708 connected to a capacitance load. The gate of the output signal NMOS 706 of an internal circuit which is to serve as the input signal and not shown in the drawing is also connected. A current path from the output terminal 708 to a ground potential as a power supply potential different from $V_2$ is formed by the source-drain path of NMOS 706.

Incidentally, there may be the case where both PMOS 705 and NMOS 706 are ON under the transient state but they operate under the steady state in such a manner that both of them are not ON simultaneously. Accordingly, the "0" level of the output circuit consisting of PMOS 705 and NMOS 706 is 0 V and its "1" level is $V_2$ V.

When the output of the counter-part power supply designation means 701 is at the "1" level, on the contrary, PMOS 703 is ON while PMOS 704 is OFF. Therefore, the power supply potential $V_1$ is applied to the source of PMOS 705 and the "1" level being $V_1$ V.

In the embodiment shown in FIG. 7(B), a known series drop type power supply circuit (series regulator) 717 is disposed inside LSI 700 instead of introducing the counter-part power supply voltage $V_2$ through the pin, and is set so that its output voltage is equal to the counter-part power supply voltage $V_2$. The operation wherein the "1" level of the output becomes $V_1$ V or $V_2$ V in accordance with the counter-part power supply potential is the same as that of the embodiment shown in FIG. 7(A).

In the embodiment shown in FIG. 7(C), a level shift circuit 727 is disposed inside LSI 700 instead of introducing the counter-part power supply potential difference $V_2$ through the pin, and level shift is effected so that its output voltage is equal to the counter-part power supply potential difference $V_2$. Whether the "1" level of the output becomes $V_1$ V or $V_2$ V in accordance with the counter-part power supply is the same as in the embodiment shown in FIG. 7(A).

In FIGS. 7(A) to 7(C), it is possible to omit the inversion circuit 702, 712, 722 by use of the NMOSs operating complementarily with PMOS 704, 714, 724 in place of PMOSs 703, 713, 723.

Figure 16:
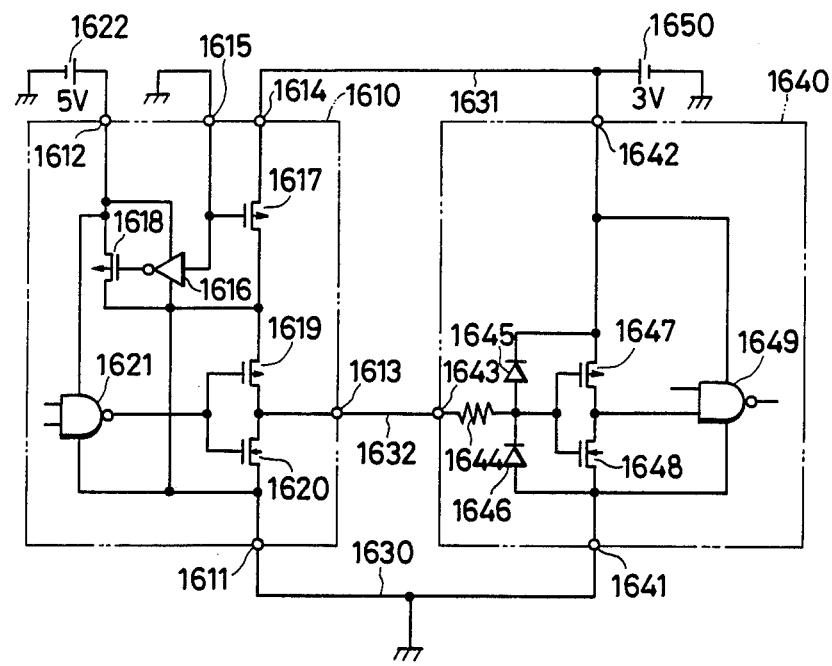
FIG. 16 shows a fifth embodiment of the present invention.

FIG. 16 shows a more detailed example of CMOS LSI operating at a first power supply (5 V) and CMOS LSI operating at a second power supply (3 V).

In the drawing, reference numeral 1610 represents CMOS LSI operating at 5 V and 1640 is CMOS LSI operating at 3 V.

In LSI 1610, reference numeral 1611 represents a reference potential pin; 1612 is a power supply pin to which a 5 V power supply is supplied; 1613 is an outlet pin; 1614 is a power supply pin to which a 3 V power supply of the counter-part is supplied; and 1615 is a program as counter-part power supply designation means. It is connected to the reference potential of the "0" level in this embodiment. Reference numeral 1616 represents an inverter circuit operating at the 5 V power supply; 1617–1619 are PMOSs; and 1620 is NMOS as the second semiconductor switch circuit. Reference numeral 1621 represents an internal gate circuit operating at the 5 V power supply and reference numeral 1622 represents the 5 V power supply.

Since the pin 1615 is connected to the reference potential in this embodiment, PMOS 1617 is ON and since the output of the inverter 1616 is at the "1" level, on the other hand, PMOS 1618 is OFF. Accordingly, the second power supply voltage 3 V is supplied to the source of PMOS 1619 as the first semiconductor switch circuit.

Therefore, the inverter circuit consisting of PMOS 1619 and NMOS 1620 supplies, to the pins 1613, 1643, 0 V or 3 V suitable for the second LSI 1640 operating at the 3 V power supply voltage in accordance with the output level of the internal gate 1621.

In LSI 1640, reference numeral 1614 represents a reference potential pin; 1642 is a power supply pin to which the 3 V power supply is supplied; 1643 is an input pin; 1644 is a protective resistor; 1645 and 1646 are protective diodes; 1647 is a PMOS; and 1648 is an NMOS. PMOS 1647 and NMOS 1648 together constitute an input circuit which operates at the 3 V power supply. Reference numeral 1649 represents an internal circuit gate operating at the 3 V power supply and 1650 is the 3 V power supply. Since the signals from 0 V to 3 V are applied to the input pin 1643, the protective diode 1645 cannot be turned ON under the normal operating state.

Therefore, normal connection is insured between LSI 1610 and LSI 1640 operating at different power supply voltages.

FIG. 18 shows the operation time chart of this embodiment. In the diagram, FIG. 18(a) shows the output waveform of the internal gate 1621 operating at the 5 V power supply voltage, and the "1" level is 5 V with the "0" level being 0 V. FIG. 18(b) shows the waveforms of the output pin 1613 of LSI 1610 and the input pin 1643 of LSI 1640. Since the counter-part power supply designation pin 1615 of FIG. 16 is connected to the reference potential as represented by solid line, "1" level is 3 V while the "0" level is 0 V. Incidentally, the waveform represented by dotted line is the waveform when the counter-part power supply is 5 V and the "1" level is 5 V. FIG. 18(c) shows the input waveform of the internal gate 1649 of FIG. 16, that is, the output waveform of the input circuit consisting of PMOS 1647 and NMOS 1648 and operating at the 3 V power supply voltage. Its "1" level is 3 V while the "0" level is 0 V.

Figure 17:
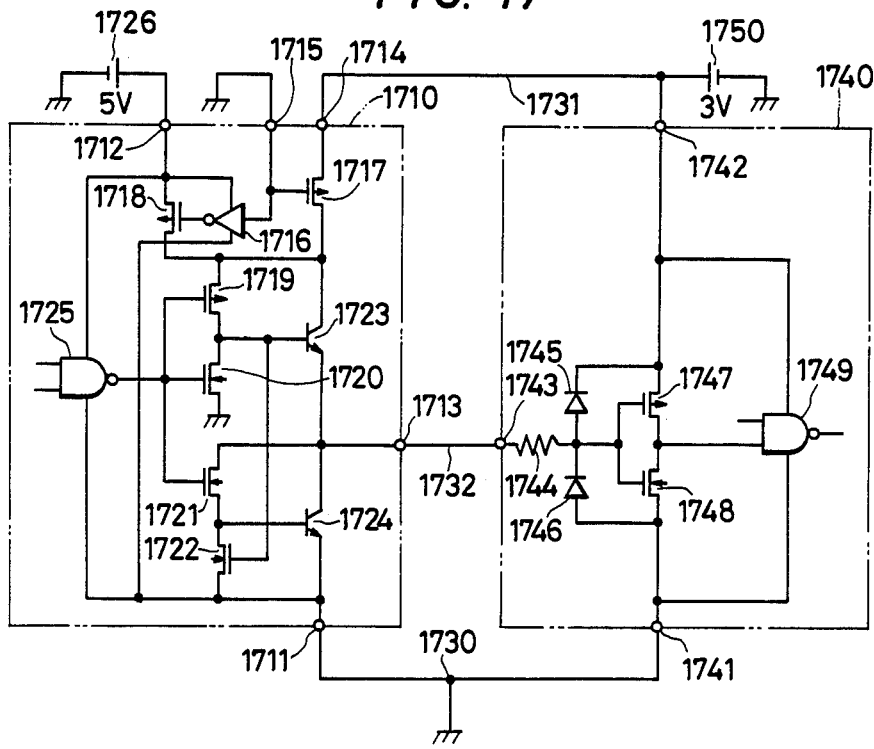
FIG. 17 shows a sixth embodiment of the present invention.

FIG. 17 shows in further detail the embodiment of a BICMOS LSI operating at the first power supply voltage (5 V) and CMOS LSI operating at the second power supply voltage (3 V).

In the circuit diagram, reference numeral 1710 represents BICMOS LSI operating at the 5 V power supply and 1740 is CMOS LSI operating at the 3 V power supply.

In LSI 1710, reference numeral 1711 represents a reference potential pin; 1712 is a power supply pin to which the 5 V power supply is supplied; 1713 is an output pin; 1714 is a power supply pin to which the counter-part 3 V power supply is supplied; 1715 is a program pin as the counter-part power supply designation means; 1716 is an inverter circuit operating at the 5 V power supply; 1717–1719 are PMOS; and 1720–1722 are NMOSs. Here, the collector-emitter current path of NPN bipolar transistor 1723 forms a current path from the selected power supply potential (3 V or 5 V) to the output terminal 1713 connected to the input buffer of the second LSI as the capacitance load. The collector-emitter current path of the NPN bipolar transistor 1724 forms a current path from the output terminal 1713 to the ground potential.

The source-drain current path of PMOS 1719 forms a current path from the selected power supply to the base of NPN 1723 in response to the output signal of the internal circuit, while the source-drain current path of NMOS 1721 forms a current path from the output terminal 1713 to the base of NPN 1724 in response to the output signal of the internal circuit, thereby driving NPN 1724 from OFF to ON. The source-drain current path of NMOS 1720 forms a current path from the base of NPN 1723 to the earth potential in response to the output signal of the internal circuit and withdraws the charge stored in the base of NPN 1723, thereby turning OFF NPN 1723 from ON. Furthermore, the source-drain current path of NMOS 1722 forms a current path from the base of NPN 1724 to the earth potential in response to ON/OFF of NPN 1723, and withdraws the charge stored at the base of NPN 1724, thereby turning OFF NPN 1724 from ON. Reference numerals 1723 and 1724 represents the NPN transistors, 1725 is an internal gate operating at the 5 V power supply and 1726 is the 5 V power supply.

Since the pin 1715 is connected to the reference potential in this embodiment, PMOS 1717 is ON and since the output of the inverter 1716 is at the "1" level, on the other hand, PMOS 1718 is OFF. Accordingly, the second power supply 3 V is supplied to the source of PMOS 1719 and to the collector of the NPN transistor 1723.

For the reason described above, the BICMOS inverter circuit consisting of PMOS 1719, NMOSs 1720, 1721, 1722 and the NPN transistors 1723, 1724 outputs $(0+V_{BE})$ V or $(3.0+V_{BE})$ V suitable for the second LSI 1740 operating at the 3 V power supply in response to the output level of the internal gate 1725, to the pins 1713 and 1743. Here, $V_{BE}$ is the base-emitter junction voltage of each NPN transistor 1723, 1724 and is about 0.7 V.

In LSI 1740, reference numeral 1741 represents a reference potential pin; 1742 is a power supply pin to which the 3 V power supply is supplied; 1743 is an input pin; 1744 is a protective resistor; 1745 and 1746 are protective diodes; 1747 is PMOS; and 1748 is NMOS. PMOS 1747 and NMOS 1748 together constitute an input circuit operating at the 3 V power supply. Reference numeral 1749 represents an internal gate operating at the 3 V power supply and 1750 is the 3 V power supply. As described above, since the signals from $(0+V_{BE})$ V to $(3.0+V_{BE})$ V are inputted to the input pin 1743, the protective diode 1745 cannot be turned ON under the normal operating state.

Therefore, normal connection is insured between LSI 1710 and LSI 1740 operating at different power supply voltages.

FIG. 19 shows the operation time chart of this embodiment. In the diagram, FIG. 19(a) represents the output of the internal gate 1725 operating at the 5 V power supply voltage and its "1" level is 5 V with the "0" level being 0 V. FIG. 19(b) shows the waveforms of the output pin 1713 of LSI 1710 shown in FIG. 17 and the input pin 1743. Since the counter-part power supply designation pin 1715 is connected to the reference potential as represented by solid line, the "1" level is $(3.0-V_{BE})=2.3$ V and the "0" level is $(0+V_{BE})=0.7$ V. Incidentally, the waveform represented by dotted line is the waveform when the counter-part power supply is 5 V and the "1" level is $(5.0-V_{BE})=4.3$ V. FIG. 19(c) shows the input waveform of the internal gate 1749 of FIG. 17, that is, the output waveform of the input circuit consisting of PMOS 1747 and NMOS 1748 and operating at the 3 V power supply. Its "1" level is 3 V and the "0" level is 0 V.

Incidentally, it is possible to use a BICMOS circuit similar to the output buffer circuit of LSI 1710 for the input buffer circuit of LSI 1740.

Furthermore, LSI 1610 and LSI 1640 in FIG. 18 may be integrated on different semiconductor substrates or on the same semiconductor substrate. This also holds true of the cases shown in FIGS. 1 to 3 and FIG. 17, etc.

As is obvious from the description given above, the present invention releases users from the problems such as the increase of power consumption and the drop of reliability resulting from mutual connection of LSIs, the addition of external-mount components, the delay of signals, and so forth, and enables them to constitute a desired electronic circuit device by arbitrarily combining a plurality of LSIs having mutually different power supply specifications.

Since one LSI can be connected to other LSIs having different power supply specifications, manufacturers of LSIs need not make custom design for each LSI user and can therefore reduce drastically the cost of production.

What is claimed is:

1. A logic circuit comprising:
    a selection signal generation circuit for generating a selection signal selecting one of a plurality of power supply potentials;
    a power supply potential selection circuit for selecting one of said power supply potentials on the basis of said selection signal;
    a first semiconductor switch circuit for forming a first current path from said selected power supply to an output terminal connected to a capacitance load in response to at least one input signal; and
    a second semiconductor switch circuit for forming a second current path from said output terminal to a power supply potential, which is not said selected power supply potential, in response to at least one input signal,
    said second semiconductor switch circuit being not turned ON simultaneously with said first semiconductor switch circuit under the steady state.

2. A logic circuit according to claim 1, wherein said selection signal generation circuit generates said selection signal on the basis of a signal applied thereto from a source external to the logic circuit.

3. A logic circuit according to claim 2, wherein said selection signal generation circuit holds a signal applied thereto from the external source for a predetermined period of time and genrerates said selection signal corresponding to said signal applied thereto from outside.

4. A logic circuit according to claim 1, wherein said power supply potential selection circuit selects one of two power supply potentials.

5. A logic circuit according to claim 4, wherein said power supply potential selection circuit consists of a third semiconductor switch circuit for selecting one of said two power supply potentials in response to said selection signal and a fourth semiconductor switch circuit for selecting the other of said two power supply potentials in response to the inversed signal of said selection signal.

6. A logic circuit according to claim 4, wherein said power supply potential selection circuit consists of a third semiconductor switch circuit for selecting one of said two power supply potentials in response to said selection signal and a fourth semiconductor switch circuit for selecting the other of said two power source potentials by operating complementary to said third semiconductor switch circuit in response to said selection signal.

7. A logic circuit according to claim 1, wherein said power supply potential selection circuit selects one of said power supply potentials from a predetermined junction of means for distributing voltage connected between a pair of power supply potentials.

8. A logic circuit according to claim 1, wherein said first semiconductor switch circuit consists of at least one field effect transistor whose gate is connected to said at least one of said input signals and whose source-drain current path forms said first current path.

9. A logic circuit according to claim 8, wherein said at least one field effect transistor is a field effect transistor having a first conductivity type.

10. A logic circuit according to claim 1, wherein said second semiconductor switch circuit consists of at least one field effect transistor whose gate is connected to at least one input signal and whose source-drain current path forms said second current path.

11. A logic circuit according to claim 10, wherein said at least one field effect transistor is a field effect transistor having a second conductivity type.

12. A logic circuit according to claim 1, wherein said first semiconductor switch circuit consists of at least one bipolar transistor whose collector-emitter current path forms said first current path; at least one field effect transistor whose gate is connected to at least one input signal and whose source-drain current path forms a current path from said selected power supply potential to the base of said at least one bipolar transistor; and a semiconductor device connected to the base of said at least one bipolar transistor and withdrawing the charge stored at said base.

13. A logic circuit according to claim 12, wherein said at least one bipolar transistor is a bipolar transistor having the base of a first conductivity type and the collector and emitter having a second conductivity type, and said at least one field effect transistor is a field effect transistor having said first conductivity type.

14. A logic circuit according to claim 1, wherein said second semiconductor switch circuit consists of at least one bipolar transistor whose collector-emitter current path forms said second current path; at least one field effect transistor whose gate is connected to at least one input signal and whose source-drain current path forms a current path from said output terminal to the base of said at least one bipolar transistor; and a semiconductor device connected to the base of said at least one bipolar transistor and withdrawing the charge stored at said base.

15. A logic circuit according to claim 14, wherein said at least one bipolar transistor is a bipolar transistor having the base of a first conductivity type and the collector and emitter of a second conductivity type, and said at least one field effect transistor is a field effect transistor of the second conductivity type.

16. In a semiconductor integrated circuit device of the type wherein an input buffer circuit for inputting an external signal, an internal circuit for exhibiting a predetermined functional operation on the basis of the signal from said input buffer circuit and an output buffer circuit for outputting the output signal of said internal circuit to an external element are integrated on the same semiconductor substrate, the improvement wherein said output buffer circuit comprises:
a selection signal generation circuit for generating a selection signal for selecting one of a plurality of power supply potentials;
a power supply potential selection circuit for selecting one of said power supply potentials on the basis of said selection signal;
a first semiconductor switch circuit for forming a first current path from said selected power supply potential to the output terminal to be connected to said external element in response to the output signal of at least one of said internal circuits; and
a second semiconductor switch circuit for forming a second current path from said output terminal to a power supply potential, which is different from said selected power supply potential, in response to the output signal of at least one of said internal circuits;
said second semiconductor switch circuit being not turned ON simultaneously with said first semiconductor switch circuit under the steady state.

17. A semiconductor integrated circuit device according to claim 16, wherein said input buffer circuit and/or said internal circuit operates between one of said power supply potentials and a power supply potential which is different from said selected power supply potential.

18. A semiconductor integrated circuit device according to claim 17, wherein said input buffer circuit and/or said internal circuit operates between the maximum value of a plurality of said power supply potentials and a power supply potential which is different from said selected power supply potential.

19. A semiconductor integrated circuit device according to claim 17, wherein said internal circuit performs a predetermined logical functional operation on the basis of the signal from said input buffer circuit.

20. A semiconductor integrated circuit device according to claim 16, wherein said selection signal generation circuit generates said selection signal on the basis of the signal applied thereto from outside of the semiconductor integrated circuit device.

21. A semiconductor integrated circuit device according to claim 20, wherein said selection signal generation circuit holds the signal applied thereto from outside for a predetermined period of time and generates said selection signal corresponding to the signal applied thereto from outside.

22. A semiconductor integrated circuit device according to claim 16, wherein said power supply potential selection circuit selects one of two power supply potentials.

23. A semiconductor integrated circuit device according to claim 22, wherein said power supply potential selection circuit consists of a third semiconductor switch circuit for selecting one of said two power supply potentials in response to said selection signal and a fourth semiconductor switch circuit for selecting the other of said two power supply potentials in response to the inversed signal of said selection signal.

24. A semiconductor integrated circuit device according to claim 22, wherein said power supply potential selection circuit consists of a third semiconductor switch circuit for selecting one of said two power supply potentials in response to said selection signal and a fourth semiconductor switch circuit for selecting the other of said two power supply potentials by operating complementarily with said third semiconductor switch circuit in response to said selection signal.

25. A semiconductor integrated circuit device according to claim 16, wherein said power supply potential selection circuit selects one of said power supply potentials from a predetermined junction of means for distributing voltage connected between a pair of power supply potentials.

26. A semiconductor integrated circuit device according to claim 16, wherein said first semiconductor switch circuit consists of at least one field effect transistor whose gate is connected to at least one of said input signals and whose source-drain current path forms said first current path.

27. A semiconductor integrated circuit device according to claim 16, wherein said at least one field effect transistor is a field effect transistor having a first conductivity type.

28. A semiconductor integrated circuit device according to claim 16, wherein said second semiconductor switch circuit consists of at least one field effect transistor whose gate is connected to at least one of said input signals and whose source-drain current path forms said second current path.

29. A semiconductor integrated circuit device according to claim 28, wherein said at least one field effect transistor is a field effect transistor having a second conductivity type.

30. A semiconductor integrated circuit device according to claim 16, wherein said first semiconductor switch circuit consists of at least one bipolar transistor whose collector-emitter current path forms said first current path; at least one field effect transistor whose gate is connected to at least one input signal and whose source-drain current path forms a current path from said selected power supply potential to the base of said at least one bipolar transistor; and a semiconductor device, connected to the base of said at least one bipolar transistor, and withdrawing the charge stored at said base.

31. A semiconductor integrated circuit device according to claim 30, wherein said at least one bipolar transistor is a bipolar transistor having the base of a first conductivity type and the collector and emitter of a second donductivity type, and said at least one field effect transistor is a field effect transistor of the first conductivity type.

32. A semiconductor integrated circuit device according to claim 16, wherein said second semiconductors switch circuit consists of at least one bipolar transistor whose collector-emitter current path forms said second current path; at least one field effect transistor whose gate is connected to at least one input signal and whose source-drain current path forms a current path from the output terminal to the base of said at least one bipolar transistor; and a semiconductor device connected, to the base of said at least one bipolar transistor, and withdrawing the charge stored at said base.

33. A semiconductor integrated circuit device according to claim 32, wherein said at least one bipolar transistor is a bipolar transistor having the base of a first conductivity type and the collector and emitter of a second conductivity type, and said at least one field effect transistor is a field effect transistor of the second conductivity type.

34. In a semiconductor integrated circuit device system including:
a first semiconductor integrated circuit device including an input buffer circuit for inputting external signals, an internal circuit for conducting a predetermined functional operation on the basis of the signal from said input buffer circuit and an output buffer circuit for providing the output signal of said internal circuit to an external element, that are integrated on the same semiconductor substrate; and
a second semiconductor integrated circuit device including an input circuit for inputting the signal from said output buffer circuit of said first semiconductor integrated circuit device, an internal circuit for conducting a predetermined functional operation on the basis of the signal from said input buffer circuit and an output buffer circuit for providing the output signal of said internal circuit to an external element that are integrated on the same semiconductor substrate;

the improvement wherein said output buffer circuit of said first semiconductor integrated circuit device comprises:
a selection signal generation circuit generating a selection signal for selecting one of a plurality of power supply potentials including the power supply potential corresponding to the operation power supply potential difference of said input buffer circuit of said second semiconductor integrated circuit device;
a power supply potential selection circuit for selecting the operation power supply potential of said input buffer circuit of said second semiconductor integrated circuit device on the basis of said selection signal;
a first semiconductor switch circuit for forming a first current path from said selected power supply potential to the output terminal connected to said input buffer circuit of said second semiconductor integrated circuit device in response to the output signal of at least one of said internal circuits; and
a second semiconductor switch circuit for forming a second current path from said output terminal to a power supply potential, which is different from said selected power supply potential;
said second semiconductor switch circuit being not turned ON simultaneously with said first semiconductor switch circuit under the steady state.

35. A semiconductor integrated circuit device system according to claim 34, wherein said first and second semiconductor integrated circuit devices are integrated on mutually different semiconductor substrates.

36. A semiconductor integrated circuit device system according to claim 34, wherein said first and second semiconductor integrated circuit devices are integrated on the same semiconductor substrate.

37. A semiconductor integrated circuit device system according to claim 34, wherein said input buffer circuit and/or said internal circuit operates between one of said power supply potentials and a power supply potential different from said selected power supply potential.

38. A semiconductor integrated circuit device system according to claim 37, wherein said input buffer circuit and/or said internal circuit operates between the maximum value of said power supply potentials and a power supply potential different from said selected power supply potential.

39. A semiconductor integrated circuit device system according to claim 34, wherein said internal circuit conducts a predetermined logical functional operation on the basis of the signal from said input buffer circuit.

40. A semiconductor integrated circuit device system according to claim 34, wherein said selection signal generation circuit generates said selection signal on the basis of the signal applied thereto from said second semiconductor integrated circuit device.

41. A semiconductor integrated circuit device system according to claim 40, wherein said selection signal generation circuit holds the signal applied thereto from said second semiconductor integrated circuit device for a predetermined period and generates said selection signal corresponding to the signal applied thereto from said second semiconductor integrated circuit device.

42. A semiconductor integrated circuit device system according to claim 34, wherein said power supply selection circuit selects one of two power supply potentials.

43. A semiconductor integrated circuit device system according to claim 42, wherein said power supply selection circuit consists of a third semiconductor switch circuit for selecting one of said two power supply potentials in response to said selection signal, and a fourth semiconductor switch circuit for selecting the other of said two power supply potentials in response to the inversed signal of said selection signal.

44. A semiconductor integrated circuit device system according to claim 42, wherein said power supply selection circuit consists of a third semiconductor switch circuit for selecting one of said two power supply potentials in response to said selection signal and a fourth semiconductor switch circuit for selecting the other of said two power supply potentials by operating complementarily to said third semiconductor switch circuit in response to said selection signal.

45. A semiconductor integrated circuit device system according to claim 34, wherein said power supply selection circuit selects one of said power supply potentials from a predetermined junction of voltage distribution means connected between a pair of power supply potentials.

46. A semiconductor integrated circuit device system according to claim 34, wherein said first semiconductor switch circuit consists of at least one field effect transistor whose gate is connected to at least one of said input signals and whose source-drain current path forms said first current path.

47. A semiconductor integrated circuit device system according to claim 46, wherein said at least one field effect transistor is a field effect transistor having a first conductivity type.

48. A semiconductor integrated circuit device system according to claim 34, wherein said second semiconductor switch consists of at least one field effect transistor whose gate is connected to at least one of said input signals and whose source-drain current path forms said second current path.

49. A semiconductor integrated circuit device system according to claim 48, wherein said at least one field effect transistor is a field effect transistor having a second conductivity type.

50. A semiconductor integrated circuit device system according to claim 34, wherein said first semiconductor switch circuit consists of at least one bipolar transistor whose collector-emitter current path forms said first current path; at least one field effect transistor whose gate is connected to at least one input signal and whose source-drain current path forms a current path from said selected power supply potential to the base of said at least one bipolar transistor; and a semiconductor device, connected to the base of said at least one bipolar transistor, and withdrawing the charge stored at said base.

51. A semiconductor integrated circuit device system according to claim 50, wherein said at least one bipolar transistor is a bipolar transistor having the base of a first conductivity type and the collector and emitter of a second conductivity type, and said at least one field effect transistor is a field effect transistor of the first conductivity type.

52. A semiconductor integrated circuit device system according to claim 34, wherein said second semiconductor switch circuit consists of at least one bipolar transistor whose collector-emitter current path forms said second current path; at least one field effect transistor whose gate is connected to at least one input signal and whose source-drain current path forms a current path from said output terminal to the base of said at least one bipolar transistor; and a semiconductor device connected to the base of said at least one bipolar transistor and withdrawing the charge stored at said base.

53. A semiconductor integrated circuit device system according to claim 52, wherein said at least one bipolar transistor is a bipolar transistor having the base of a first conductivity type and the collector and emitter of a second conductivity type, and said at least one field effect transistor is a field effect transistor of the second conductivity type.

54. A semiconductor integrated circuit device system according to claim 34, wherein at least one of said input buffer circuits of said second semiconductor integrated circuit device includes a first semiconductor switch circuit for forming a third current path from a predetermined power supply potential to the output terminal connected to said internal circuit in response to the output signal of said output buffer circuit of said first semiconductor integrated circuit device; and a second semiconductor switch circuit for forming a fourth current path from said output terminal to a power supply potential, which is different from said predetermined power supply potential, in response to the output signal of said output buffer circuit of said first semiconductor integrated circuit device.

55. A semiconductor integrated circuit device system according to claim 54, wherein said first semiconductor switch circuit of said second semiconductor integrated circuit device consists of at least one field effect transistor whose gate is connected to the output signal of said output buffer circuit of said first semiconductor integrated circuit device and whose source-drain current path forms said third current path.

56. A semiconductor integrated circuit device system according to claim 55, wherein said at least one field effect transistor is a field effect transistor of a first conductivity type.

57. A semiconductor integrated circuit device system according to claim 54, wherein said second semiconductor switch circuit of said second semiconductor integrated circuit device consists of at least one field effect transistor whose gate is connected to the output signal of said output buffer circuit of said first semiconductor integrated circuit device and whose source-drain current path forms said fourth current path.

58. A semiconductor integrated circuit device system according to claim 57, wherein said at least one field effect transistor is a field effect transistor of the second conductivity type.

59. A semiconductor integrated circuit device system according to claim 54, wherein said first semiconductor switch circuit of said second semiconductor integrated circuit device consists of at least one bipolar transistor whose collector-emitter current path forms said third current path; at least one field effect transistor whose gate is connected to the output signal of said output buffer circuit of said first semiconductor integrated circuit device and whose source-drain current path forms a current path from said selected power supply potential to the base of said at least one bipolar transistor; and a semiconductor device, connected to the base of said at least one bipolar transistor, withdrawing the charge at said base.

60. A semiconductor integrated circuit device system according to claim 59, wherein said at least one bipolar transistor is a bipolar transistor having the base of a first conductivity type and the collector and emitter of a second conductivity type, and said at least one field effect transistor is a field effect transistor of the first conductivity type.

61. A semiconductor integrated circuit device system according to claim 54, wherein said second semiconductor switch circuit of said second semiconductor integrated circuit device consists of at least one bipolar transistor whose collector-emitter current path forms said fourth current path; a field effect transistor whose gate is connected to the output signal of said output buffer circuit of said first semiconductor integrated circuit device and whose source-drain current path forms a current path from said output terminal to the base of said at least one bipolar transistor; and a semiconductor device, connected to the base of said at least one bipolar transistor, withdrawing the charge stored at said base.

62. A semiconductor integrated circuit device system according to claim 61, wherein said at least one bipolar transistor is a bipolar transistor having the base of a first conductivity type and the collector and emitter of a second conductivity type, and said at least one field effect transistor is a field effect transistor of the second conductivity type.

63. A semiconductor integrated circuit device system according to claim 16, wherein said selection signal generation circuit and/or said power supply potential selection circuit is disposed in the unit of said first and second semiconductor switch circuits.

64. A semiconductor integrated circuit device system according to claim 16, wherein said selection signal generation circuit and/or said power supply potential selection circuit is disposed in the unit of group consisting of plurality each of said first and second semiconductor switch circuits.

65. A semiconductor integrated circuit device system according to claim 34, wherein said second semiconductor integrated circuit device is memory LSI.

66. A semiconductor integrated circuit device characterized in that when counter-part power supply designation means designates a level such that the output circuit of a bi-directional input/output circuit to the common pin of which the output of an output circuit and the input of an input circuit in a first semiconductor integrated circuit device operating at a first power supply attains an output level suitable for the input of a second power supply system, the logical threshold values of the input circuits connected to the same pin are simultaneously controlled in such a manner as to be adaptive to the output level of LSI operating at a second power supply.

* * * * *

UNITED STATES PATENT AND TRADEMARK OFFICE
CERTIFICATE OF CORRECTION

PATENT NO. : 4,853,560

DATED : August 1, 1989

INVENTOR(S) : M. Iwamura, et al.

It is certified that error appears in the above-identified patent and that said Letters Patent is hereby corrected as shown below: Title page:

ABSTRACT, line 10, change "difference, lower" to --difference is lower--.

Column 1, line 23, change "difference" to --different--.

Column 2, line 15, change "0 for V" to --0V--.

Column 7, line 6, change "menas" to --means--.

Column 7, lines 35 and 43, insert --to-- between "designates" and "the".

Column 7, line 66, change "circuit 422 is" to --circuit; 422 is--.

Column 8, line 3, insert --to-- between "designates" and "the".

Column 8, line 67, change "a example" to --an example--.

UNITED STATES PATENT AND TRADEMARK OFFICE
CERTIFICATE OF CORRECTION

PATENT NO. : 4,853,560

DATED : August 1, 1989

INVENTOR(S) : M. Iwamura, et al.

It is certified that error appears in the above-identified patent and that said Letters Patent is hereby corrected as shown below:

Column 9, line 44, should read --the source of PMOS 705 and the "0" level of the output circuit is 0V with its "1" level being $V_1$V.--

Column 13, line 4, change "genrerates" to --generates--.

Column 15, line 58, delete "and".

Column 15, line 64, change "donductivity" to --conductivity--.

Column 16, line 8, delete the comma after "nected".

Column 16, line 9, delete "and".

UNITED STATES PATENT AND TRADEMARK OFFICE
CERTIFICATE OF CORRECTION

PATENT NO. : 4,853,560

DATED : August 1, 1989

INVENTOR(S) : M. Iwamura, et al.

It is certified that error appears in the above-identified patent and that said Letters Patent is hereby corrected as shown below:

Column 18, line 23, delete "and".

Column 20, line 27, --ing of a plurality of each of said...--.

Signed and Sealed this

Fourteenth Day of August, 1990

Attest:

HARRY F. MANBECK, JR.

*Attesting Officer*  *Commissioner of Patents and Trademarks*

REEXAMINATION CERTIFICATE (2085th)
United States Patent [19]
Iwamura et al.

[11] B1 4,853,560
[45] Certificate Issued  Sep. 7, 1993

[54] LOGIC CIRCUIT AND SEMICONDUCTOR INTEGRATED CIRCUIT DEVICE CAPABLE OF OPERATING BY DIFFERENT POWER SUPPLIES

[75] Inventors: Masahiro Iwamura; Hideo Maejima; Ikuro Masuda, all of Hitachi, Japan

[73] Assignee: Hitachi, Ltd., Tokyo, Japan

Reexamination Request:
No. 90/002,568, Feb. 19, 1992

Reexamination Certificate for:
Patent No.: 4,853,560
Issued: Aug. 1, 1989
Appl. No.: 149,187
Filed: Jan. 27, 1988

Certificate of Correction issued Jan. 13, 1992.

[30] Foreign Application Priority Data

Feb. 6, 1987 [JP] Japan .................. 62-24565

[51] Int. Cl.$^5$ .................. H03K 19/003; H03K 17/10; H03K 17/06; H03K 3/013
[52] U.S. Cl. .................. 307/296.1; 307/200.1; 307/264; 307/475; 307/570

[58] Field of Search .................. 307/264, 296.1, 475

[56] References Cited

U.S. PATENT DOCUMENTS

| | | | |
|---|---|---|---|
| 4,216,390 | 8/1980 | Stewart | 307/264 |
| 4,656,373 | 4/1987 | Plus | 307/475 |
| 4,716,313 | 12/1987 | Hori et al. | 307/475 |

*Primary Examiner*—David R. Hudspeth

[57] ABSTRACT

When a counter-part power supply designator of a first LSI designates that the counter-part power supply voltage of another LSI is a first power supply difference which is the same as the power supply difference of its own, an output circuit control controls an output circuit and the output circuit produces an output signal having a level adaptive to the counter-part LSI operating at the first power supply voltage. When the counter-part power supply voltage designator designates that the counter-part power supply voltage difference is lower than the first power supply voltage difference, the output circuit control controls the output circuit and the output circuit produces an output signal having a level adaptive to the counter-part LSI operating at the second power supply voltage difference. Thus, a plurality of LSIs can be operated at mutually different power supply voltages.

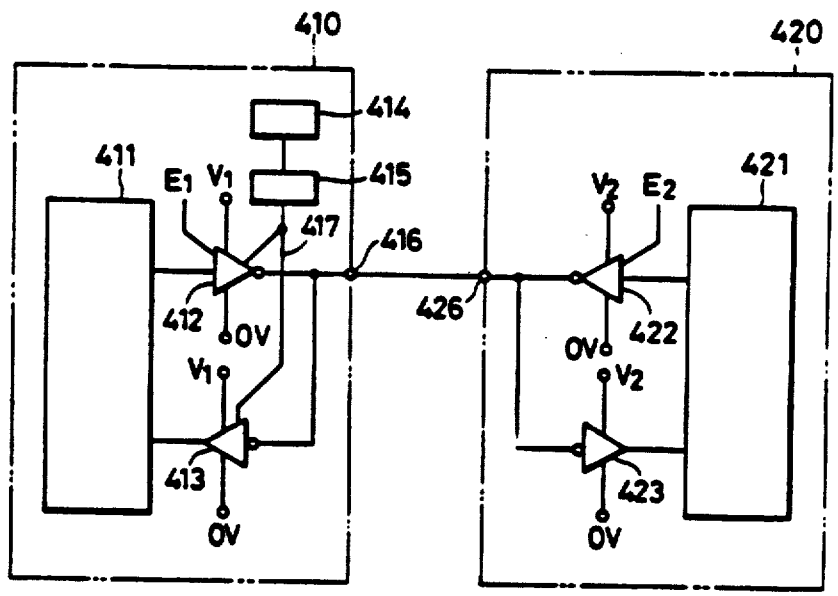

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 3, 6, 12-15, 18, 21, 24 and 30-66 is confirmed.

Claims 1-2, 4-5, 7-11, 16-17, 19-20, 22-23 and 25-29 are cancelled.

* * * * *